US005489556A

United States Patent [19]

Li et al.

[11] Patent Number: 5,489,556

[45] Date of Patent: Feb. 6, 1996

[54] METHOD FOR THE FABRICATION OF ELECTROSTATIC MICROSWITCHES

[75] Inventors: Zhijian Li; Xiqing Sun; Litian Liu; Xinyu Zheng, all of Beijing, China

[73] Assignee: United Microelectronics Corp., Hsinchu, Taiwan

[21] Appl. No.: 268,009

[22] Filed: Jun. 29, 1994

[51] Int. Cl.[6] .......... H01L 21/465

[52] U.S. Cl. .......... 437/228; 437/901; 437/927; 437/921

[58] Field of Search .......... 437/901, 927, 437/69, 228, 921

[56] References Cited

U.S. PATENT DOCUMENTS 4,744,863 5/1988 Guckel et al. .......... 156/653.1
4,975,390 12/1990 Fujii et al. .......... 437/228
5,164,339 11/1992 Gimpelson .......... 437/235

*Primary Examiner*—Mary Wilczewski
*Assistant Examiner*—H. Jey Tsai
*Attorney, Agent, or Firm*—Townsend and Townsend and Crew

[57] ABSTRACT

A method for fabricating an electrostatic microswitch has the steps of depositing a silicon nitride layer over a silicon substrate with an opening therethrough to expose the planned sacrificial layer region; oxidation to form a silicon dioxide sacrificial layer; phosphorus ion implantation into the sacrificial layer; forming a phosphorus-doped polysilicon microbeam of the microswitch and its electrode contacts; lateral etching all of the silicon dioxide sacrificial layer in buffered hydrofluoric acid to form an air gap between the microbeam and the substrate; rinsing the structure in DI water, and then in methanol; and drying the structure by a warm nitrogen flow.

8 Claims, 2 Drawing Sheets

METHOD FOR THE FABRICATION OF ELECTROSTATIC MICROSWITCHES

BACKGROUND OF THE INVENTION

The present invention relates to a method for the fabrication of an electrostatic microswitch, and more particularly to a method for fabricating an electrostatic microswitch which can improve on the downward deflection problem of the formed microbeam.

Micromechanical structures, including polysilicon beams, have been used in a variety of mechanical devices, such as resonant sensors, electrostatic micromotors, etc. For example, the literature, M. W. Putty et al., "Process Integration for Active Polysilicon Resonant Microstructures", Sensors and Actuators, 20 (1988), pp. 143–151, discusses the processing issues for integrating electrostatically-driven and -sensed polysilicon resonant microstructures with on-chip nMOS devices. Surface-micromachining using sacrificial spacer layers is utilized to obtain released resonant microstructures. Its novel feature is the use of rapid thermal annealing (RTA) for strain relief of the ion-implanted, phosphorous-doped polysilicon microstructure. The literature of R. S. Muller, "Microdynamics", Sensors and Actuators, A21–A23 (1990), pp. 1–8, discusses the possible fabrication of a new class of microdynamic mechanisms, including polysilicon resonant beams, microvalves, micromotors, microfabricated resonant structures, etc., through the exploitation of technologies based upon the IC (integrated-circuit) microfabrication process. The literature of C. Linder and N. F. de Rooij, "Investigations on Free-standing Polysilicon Beams in View of their Application as Transducers", Sensors and Actuators, A21–A23 (1990), pp. 1053–1059, discusses the fabrication and comparison of different polysilicon beams. Undoped and phosphorus-doped (P-doped) sacrificial silicon dioxide/polysilicon beam material combinations are investigated. It is concluded that the maximum flee-standing beam length is larger for the P-doped than for the undoped polysilicon beams.

It has been discussed that the key processing steps for fabricating high performance micromechanical devices are the patterning of the fine polysilicon microstructure and the lateral etching of the sacrificial layer. The present invention mainly proposes a novel polysilicon beam structure and its fabrication process in order to accomplish a high performance electrostatic microswitch.

SUMMARY OF THE INVENTION

The primary object of the present invention is to provide a method, for fabricating an electrostatic microswitch which is provided with a polysilicon microbeam without the downward deflection phenomenon.

In accordance with the present invention, a method for fabricating an electrostatic microswitch comprises the steps of:

(a) providing a silicon substrate having a certain conductivity type;

(b) depositing a silicon nitride layer over the silicon substrate with an opening therethrough to expose the planned sacrificial layer region;

(c) oxidation of the exposed silicon substrate surface to form a silicon dioxide sacrificial layer;

(d) ion implantation of a dopant into the silicon dioxide sacrificial layer to increase its lateral etch rate;

(e) depositing a layer of phosphorus-doped polysilicon over the silicon nitride and the silicon dioxide sacrificial layer;

(f) patterning the phosphorus-doped polysilicon layer by lithography and etching to form a microbeam of the electrostatic microswitch;

(g) forming at least one electrode contact on the polysilicon microbeam;

(h) forming a resist mask over the electrode contact to protect the electrode contact pattern from etching during the next lateral etching step;

(i) lateral etching all of the silicon dioxide sacrificial layer in buffered hydrofluoric acid to form an air gap between the polysilicon microbeam and the silicon substrate;

(j) rinsing the microswitch structure in DI water, and then in methanol; and (k) drying the microswitch structure by a warm nitrogen flow.

According to one preferred embodiment of the present invention, the step (d) includes the step of ion implantation of phosphorus ions into the silicon dioxide sacrificial layer with a dose of about $3\times10^{15}$ $cm^{-2}$ and implant energy of about 150 KeV. The step (e) includes the steps of depositing the phosphorus-doped polysilicon layer by LPCVD at about 750° C., and rapid thermal annealing the phosphorus-doped polysilicon layer at about 1100° C. for about 9 minutes to reduce the intrinsic mechanical stress therein.

According to one aspect of the present invention, the phosphorus-doped polysilicon microbeam has a sheet resistance of about 28Ω per square. The resist mask is a negative photoresist.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 1A:
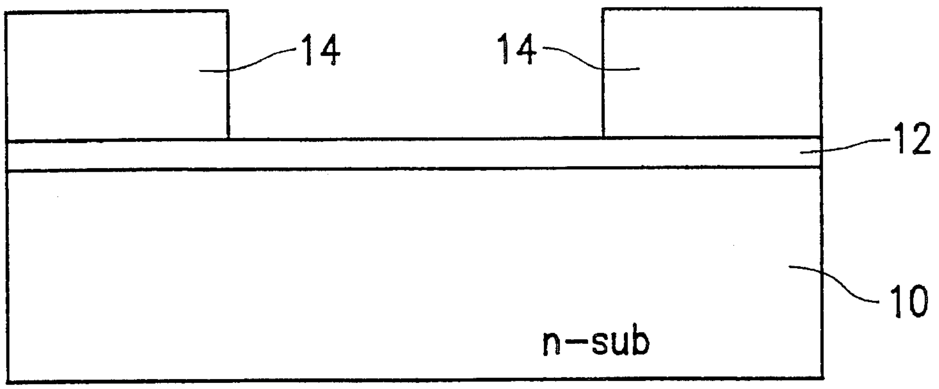
FIGS. 1(*a*) through 1(*e*) schematically show in cross section one preferred embodiment of the method for fabricating an electrostatic microswitch according to the present invention.
Figure 1B:
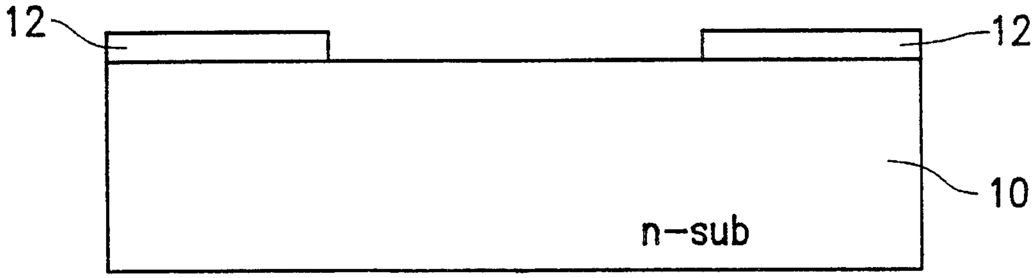
Figure 1C:
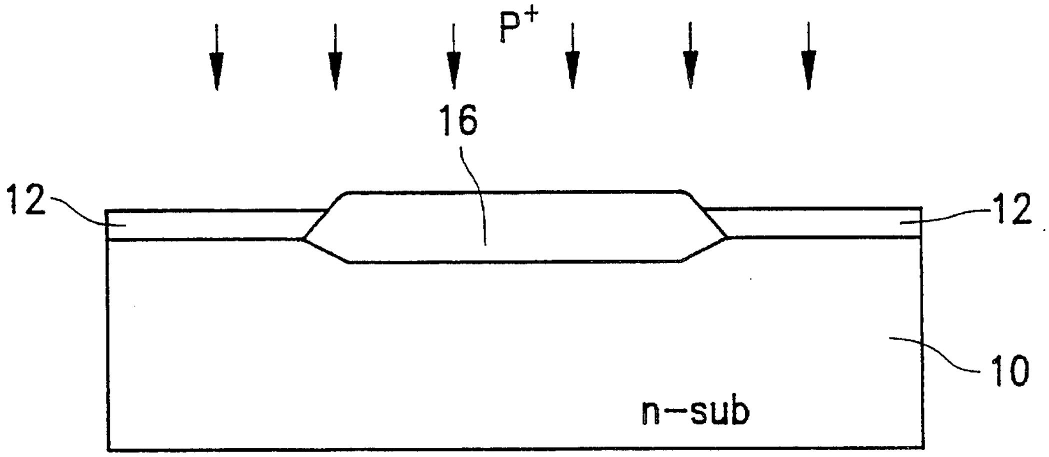
Figure 1D:
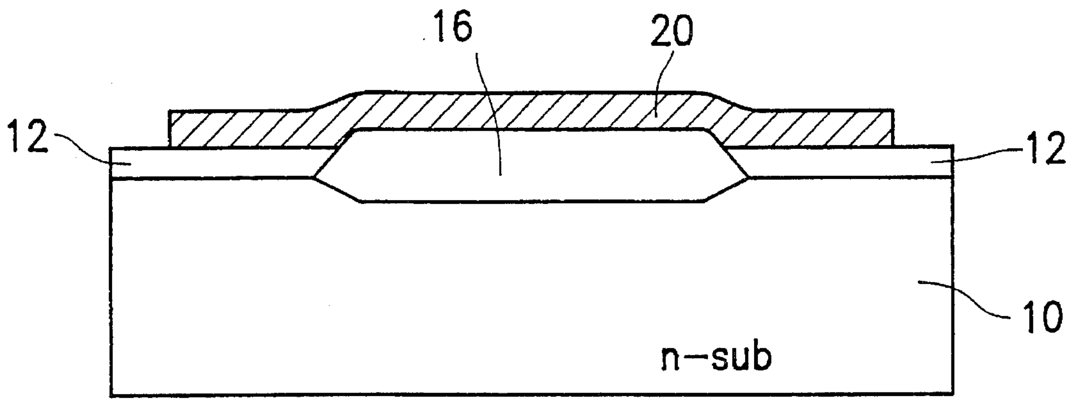
Figure 1E:
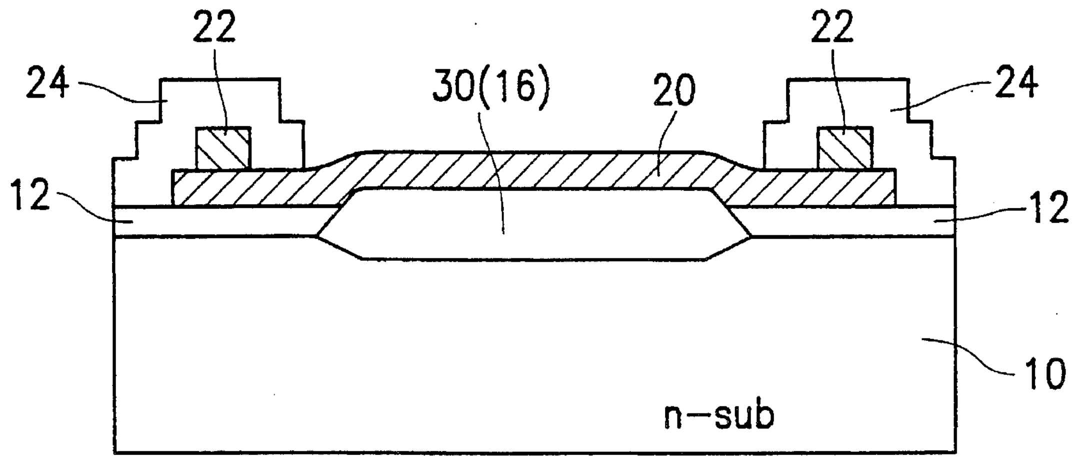

Referring now to FIGS. 1(*a*) through 1(*e*), there is shown one preferred embodiment of the method for fabricating an electrostatic microswitch according to the present invention. It should be noted that the dimensions of the electrostatic microswitch and its elements as shown in the drawings are not intended to precisely correspond to those of the real product for the sake of conveniently sketching and illustrating.

With reference to FIG. 1(*a*), a semiconductor substrate 10, for example a N-type silicon substrate, is first prepared. A layer of silicon nitride 12 is deposited over the silicon substrate 10, for example, by LPCVD (Low-Pressure Chemical Vapor Deposition). In this embodiment, the silicon nitride layer 12 preferably has a thickness of about 3500 angstroms. A block-out mask 14 of resist material is formed over the silicon nitride layer 12, and leaves uncovered the planned sacrificial layer region. This mask 14 is made by conventional lithography and etching techniques as known in the art. The portion of the silicon nitride layer which is uncovered by the mask 14 is removed by etching, and then the mask 14 is removed. The formed structure so far is clearly shown in FIG. 1(*b*).

Referring to FIG. 1(*c*), a LOCOS (Local Oxidation of Silicon) step is performed to create a recessed silicon dioxide sacrificial layer 16 in the exposed surface of the silicon substrate 10. In this embodiment, the silicon dioxide sacrificial layer 16 preferably has a thickness of about 1.1 micrometers. An ion implantation step is now performed by using, for example, phosphorus ions in order to increase the etch rate of the silicon dioxide sacrificial layer 16.

Referring to FIG. 1(*d*), a layer of phosphorus-doped polysilicon 20 is deposited, for example, by LPCVD at about 750° C., and treated by rapid thermal annealing at about 1100° C. for about 9 minutes to reduce the intrinsic mechanical stress therein. Then, the P-doped polysilicon layer 20 is patterned by using conventional lithography and etching techniques to define the microbeam pattern of the electrostatic microswitch.

Referring to FIG. 1(*e*), an aluminum metallization process is then performed by using conventional deposition, lithography, and etching techniques to form the electrode contacts 22. After Al metallization, a mask 24 of resist material, for example a negative photoresist, is formed to protect the Al patterns from etching during the next lateral etching step of the silicon dioxide sacrificial layer 16. Then, a lateral etching step of the silicon dioxide sacrificial layer 16 is performed in BHF (buffered hydrofluoric acid), for example about 5:1, to produce the electrostatic microswitch structure. When the sacrificial layer 16 is etched away, an air gap 30 as shown in FIG. 1(*e*) is formed between the polysilicon microbeam 20 and the silicon substrate 10 to permit the free-standing portion of the microbeam 20 to move towards or away from the silicon substrate 10. The preferable microswitch dimensions are of microbeam length between about 50–250 micrometers, microbeam width between 25–100 micrometers, microbeam thickness of about 1 micrometer, and air gap depth of about 1.1 micrometer.

The lateral etch rate of the silicon dioxide sacrificial layer 16 is a very important parameter in the present invention. From experiments, the lateral etch rate of undoped silicon dioxide is about 1.1 micrometers/min., and the lateral etch rate of phosphorus-doped silicon dioxide with a dose of about $3\times 10^{15}$ $cm^{-2}$ and implant energy of about 150 KeV is up to 3.4 micrometers/min. This reveals that phosphorus atoms can speed up the lateral etching of the silicon dioxide sacrificial layer 16, and provide the possibility of protecting the aluminum patterns 22 and other prefabricated patterns simply by the use of photoresist material 24.

It is also noted in the experiments that phosphorus atoms also have a great effect on the mechanical properties of the polysilicon microbeam layer 20. All of the phosphorus-doped polysilicon microbeams with a sheet resistance of 28Ω per square fabricated according the method of the present invention are free of stress, and do not bend downward at all after the final lateral etching. But all undoped polysilicon microbeams with a length exceeding 50 micrometers are bent downward to the silicon substrate due to the compressive stress. In addition to the intrinsic stress of the polysilicon microbeam layer, it is found that the adhesion force of water particles which remain between the polysilicon microbeam and the silicon substrate might also be the cause of the bending. Therefore, in the present invention, the microswitch structure after lateral etching is further rinsed in DI water, then rinsed in methanol for more than 15 minutes, and finally well dried by a warm nitrogen flow. This process improves the linearity of the polysilicon microbeam in free-flat state to a great extent.

In applications, when the upper and lower electrodes of the electrostatic microswitch, i.e. the polysilicon microbeam and the silicon substrate, are oppositely charged, the upper electrode will be attracted to bend down toward the lower electrode, and at the same time the elastic restoring force of the polysilicon microbeam increases. Thus, a balance of the electrical attraction and elastic restoring force will be reached for any definite applied voltage that determines the microbeam bending position. A short theoretical deduction shows that there is a critical voltage Vt. about which the bending will produce near contact of the two electrodes, and discharge can take place. After discharge, the microbeam electrode tends to restore its flat state by the simple restoring force in the stressed condition.

Thus, if there is a d.c. voltage applied to the microswitch, the two electrodes become electrically charged when they separate from each other, and the electrical attraction appears again. Repetition of the above process can produce an oscillation of the microbeam and repeated electrical switching on and off in the outside circuit as well. This phenomenon can be used for implementation of a V-F (voltage-frequency) converter.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating an electrostatic microswitch comprising the steps of:

(a) providing a silicon substrate having a certain conductivity type;

(b) depositing a silicon nitride layer over said silicon substrate with an opening therethrough to expose a portion of said silicon substrate;

(c) oxidizing said exposed silicon substrate surface to form a silicon dioxide sacrificial layer;

(d) ion implantation of a dopant into said silicon dioxide sacrificial layer to increase its lateral etch rate;

(e) depositing a layer of phosphorus-doped polysilicon over said silicon nitride and said silicon dioxide sacrificial layer;

(f) patterning said phosphorus-doped polysilicon layer by lithography and etching to form a polysilicon microbeam of said electrostatic microswitch;

(g) forming at least one electrode contact on said polysilicon microbeam;

(h) forming a resist mask over said electrode contact to protect the electrode contact pattern from etching during a lateral etching step;

(i) laterally etching all of said silicon dioxide sacrificial layer in buffered hydrofluoric acid to form an air gap between said polysilicon microbeam and said silicon substrate;

(j) rinsing said microswitch structure in DI water, and then in methanol; and (k) drying said microswitch structure by a warm nitrogen flow.

2. The method of claim 1, wherein the step (d) includes the step of ion implantation of phosphorus ions into said silicon dioxide sacrificial layer with a dose of about $3\times10^{15}$ $cm^{-2}$ and implant energy of about 150 KeV.

3. The method of claim 2, wherein the step (e) includes the steps of depositing said phosphorus-doped polysilicon layer by LPCVD at about 750° C., and rapid thermal annealing said phosphorus-doped polysilicon layer at about 1100° C. for about 9 minutes to reduce the intrinsic mechanical stress therein.

4. The method of claim 3, wherein said phosphorus-doped polysilicon microbeam has a sheet resistance of about 28Ω per square.

5. The method of claim 4, wherein said resist mask is a negative photoresist.

6. The method of claim 5, wherein said polysilicon microbeam preferably has a length between about 50–250 micrometers, a width between about 25–100 micrometers, and a thickness of about 1 micrometer.

7. The method of claim 6, wherein said silicon dioxide sacrificial layer formed in the step (c) preferably has a thickness of about 1.1 micrometers.

8. The method of claim 7, wherein said silicon nitride formed in the step (b) preferably has a thickness of about 3500 angstroms.

* * * * *